(12) United States Patent
Bergendahl et al.

(10) Patent No.: US 10,326,017 B2
(45) Date of Patent: Jun. 18, 2019

(54) FORMATION OF A BOTTOM SOURCE-DRAIN FOR VERTICAL FIELD-EFFECT TRANSISTORS

(71) Applicant: International Business Machines Corporation, Armonk, NY (US)

(72) Inventors: Marc A. Bergendahl, Troy, NY (US); Kangguo Cheng, Schenectady, NY (US); Fee Li Lie, Albany, NY (US); Shogo Mochizuki, Clifton Park, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/702,878

(22) Filed: Sep. 13, 2017

(65) Prior Publication Data

US 2018/0006151 A1   Jan. 4, 2018

Related U.S. Application Data

(62) Division of application No. 15/196,375, filed on Jun. 29, 2016, now Pat. No. 9,799,765.

(51) Int. Cl.
| | |
|---|---|
| *H01L 29/08* | (2006.01) |
| *H01L 29/66* | (2006.01) |
| *H01L 29/78* | (2006.01) |
| *H01L 29/417* | (2006.01) |

(52) U.S. Cl.
CPC .... *H01L 29/7827* (2013.01); *H01L 29/41791* (2013.01); *H01L 29/66545* (2013.01); *H01L 29/66666* (2013.01); *H01L 29/66795* (2013.01); *H01L 29/785* (2013.01); *H01L 29/0847* (2013.01)

(58) Field of Classification Search
CPC ................... H01L 29/7827; H01L 21/823431
See application file for complete search history.

(56) References Cited

U.S. PATENT DOCUMENTS

| | | | |
|---|---|---|---|
| 2014/0048881 A1* | 2/2014 | Kanike | H01L 29/66545 257/347 |
| 2017/0125585 A1* | 5/2017 | Chiang | H01L 21/823807 |

OTHER PUBLICATIONS

List of IBM Patents or Patent Applications Treated as Related, U.S. Appl. No. 15/702,878, filed Sep. 13, 2017, 2 Pages.

(Continued)

*Primary Examiner* — Farun Lu
(74) *Attorney, Agent, or Firm* — Cantor Colburn LLP; Vazken Alexanian

(57) ABSTRACT

In an embodiment, this invention relates to a vertical field-effect transistor component including a bottom source-drain layer and a method of creating the same. The method of forming a bottom source-drain layer of a vertical field-effect transistor component can comprise forming an anchor structure on a substrate. A sacrificial layer can be deposited on a middle region of the substrate and a channel layer can be deposited on the sacrificial layer. A plurality of vertical fins can be formed on the substrate and the sacrificial layer can be removed such that the plurality of vertical fins in the middle region form a plurality of floating fins having a gap located between the plurality of floating fins and the substrate. The bottom source-drain layer can then be formed such that the bottom source-drain layer fills in the gap.

12 Claims, 6 Drawing Sheets

(56) References Cited

OTHER PUBLICATIONS

Marc A. Bergendahl, et al. "Formation of a Bottom Source-Drain for Vertical Field-Effect Transistors," U.S. Appl. No. 15/196,375, filed Jun. 29, 2016.
Brent A. Anderson, et al. "Vertical FET Structure," U.S. Appl. No. 15/139,937, filed Apr. 27, 2016.

* cited by examiner

FORMATION OF A BOTTOM SOURCE-DRAIN FOR VERTICAL FIELD-EFFECT TRANSISTORS

DOMESTIC AND/OR FOREIGN PRIORITY

This application is a divisional of U.S. application Ser. No. 15/196,375, titled "FORMATION OF A BOTTOM SOURCE-DRAIN FOR VERTICAL FIELD-EFFECT TRANSISTORS" filed Jun. 29, 2016, the entire contents of which are incorporated herein by reference.

BACKGROUND

The present invention relates to a method of forming a bottom source-drain for vertical field-effect transistors and the vertical field-effect transistors formed therefrom.

In a conventional field-effect transistor (FET), the source, the drain, and the gate electrodes are arranged on the same major surface of a semiconductor, where the gate voltage controls current flow in a direction parallel to the major surface of the semiconductor that extends between the source and drain. The performance of a conventional FET depends on the doping profile, the quality of the material proximate the surface (i.e., the active layer), and the geometry of the device.

In some applications, for example, where high power capability is desired, multiple conventional FET devices are connected in parallel with one another. Because all three of the source, the drain, and the gate electrodes of each respective conventional FET are located on the same surface, relatively complicated crossover metallization patterns are required to effect the parallel connections.

In order to overcome some of these drawbacks, vertical FETs were developed. In contrast to conventional FETs, in vertical FET devices, the source to drain current flows in a direction perpendicular to the major surface of the semiconductor. For example, if the substrate surface is made horizontal, then the vertical FET is typically a vertical pillar with the drain and source being the top and bottom portion of the pillar. One of the main advantages of the vertical FET is that the channel length is not defined by lithography, but rather by methods such as epitaxial growth or layer deposition, which can provide good thickness control even at nanometer dimensions.

SUMMARY

According to an embodiment of the present invention, a method of forming a bottom source-drain layer of a vertical field-effect transistor component includes forming an anchor structure on a substrate such that the substrate includes a first anchor region, a second anchor region, and a middle region located there between. A sacrificial layer is deposited on the middle region of the substrate and a channel layer is deposited on the sacrificial layer. A plurality of vertical fins are formed on the substrate and the sacrificial layer is removed such that the plurality of vertical fins in the middle region form a plurality of floating fins having a gap located between the plurality of floating fins and the substrate. The bottom source-drain layer is then formed such that the bottom source-drain layer fills in the gap.

According to another embodiment, a method of forming a bottom source-drain layer of a vertical field-effect transistor component includes forming an anchor structure on a substrate such that the substrate includes a first anchor region, a second anchor region, and a middle region located there between. A sacrificial layer is deposited on the middle region of the substrate and a channel layer is deposited on the sacrificial layer. A fin layer is deposited on the channel layer and on the anchor structure and a patterned mandrel layer is formed on the fin layer. A sidewall spacer layer is deposited on the patterned mandrel layer and the fin layer. A plurality of vertical fins is formed from the sidewall spacer layer and the forming exposes the sacrificial layer. The plurality of vertical fins comprise the sidewall spacer layer, the fin layer, and the channel layer and span the middle region from the first anchor region to the second anchor region. An oxide liner is deposited and a liner etch back of the oxide liner is performed. The sacrificial layer is removed such that the plurality of vertical fins in the middle region form a plurality of floating fins having a gap located between the plurality of floating fins and the substrate and the bottom source-drain layer is deposited such that the bottom source-drain layer fills in the gap.

Yet, according to another embodiment, a vertical field-effect transistor component includes a substrate; a bottom source-drain layer located on the substrate; and a plurality of vertical fins. The plurality of vertical fins includes a channel layer, a fin layer, and a sidewall spacer layer. The channel layer is located in between the bottom source-drain layer and the fin layer and the fin layer is located in between the channel layer and the sidewall spacer layer.

BRIEF DESCRIPTION OF THE DRAWINGS

Refer now to the figures, which are exemplary embodiments, and wherein the like elements are numbered alike.

FIG. 1 is an illustration of an embodiment of a cross-section of a vertical FET component having an anchor structure formed on a substrate;

FIG. 2 is an illustration of an embodiment of a top-down view of a vertical FET component having the anchor structures formed thereon and an exposed channel layer;

FIG. 3 is an illustration of an embodiment of a cross-section of the vertical FET component of FIG. 2 through anchor structure 6 along line A;

FIG. 4 is an illustration of the cross-section of the vertical FET component of FIG. 2 through an anchor free region along line B;

FIG. 5 is an illustration of an embodiment of a cross-section of a vertical FET component having the fin layer deposited thereon;

FIG. 6 is an illustration of an embodiment of a cross-section of a vertical FET component having the patterned mandrel layer deposited thereon;

FIG. 7 is an illustration of an embodiment of a cross-section of a vertical FET component having the sidewall spacer layer deposited thereon;

FIG. 8 is an illustration of an embodiment of a cross-section of a vertical FET component having fins formed thereon;

FIG. 9 is an illustration of an embodiment of a top-down view of a vertical FET component having fins formed thereon with the sacrificial layer exposed;

FIG. 10 is an illustration of the cross-section of the structure of FIG. 9 through anchor structure 6 along line A;

FIG. 11 is an illustration of the cross-section of the structure of FIG. 9 through an anchor free region along line B;

FIG. 12 is an illustration of an embodiment of a cross-section of a vertical FET component having an oxide liner deposited thereon;

FIG. 13 is an illustration of an embodiment of a cross-section of a vertical FET component having the sacrificial layer removed;

FIG. 14 is an illustration of an embodiment of a cross-section of a vertical FET component during the formation of the bottom source-drain;

FIG. 15 is an illustration of an embodiment of a top-down view of a substrate after the bottom source-drain has been deposited;

FIG. 16 is an illustration of the cross-section of the structure of FIG. 15 through anchor structure 6 along line A;

FIG. 17 is an illustration of the cross-section of the structure of FIG. 15 through an anchor free region along line B;

FIG. 18 is an illustration of an embodiment of a cross-section of a vertical FET component having the anchor structures removed; and FIG. 19 is an illustration of an embodiment of a method of forming the bottom source-drain of the vertical FET component.

DETAILED DESCRIPTION

Figure 1:
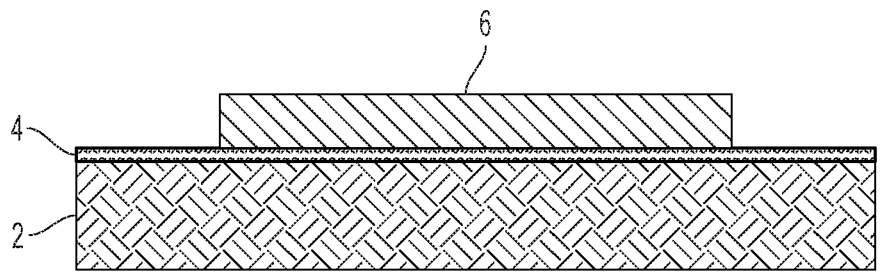
FIGS. 1-19 illustrate an embodiment of a method of preparing a bottom source-drain layer for use in a vertical FET.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

For the sake of brevity, conventional techniques related to semiconductor device and IC fabrication may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention may be individually known, the described combination of operations and/or resulting structures of the present invention are unique. Thus, the unique combination of the operations described in connection with the present invention utilize a variety of individually known physical and chemical processes performed on a semiconductor (e.g., silicon) substrate, some of which are described in the following immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

In the formation of vertical FETs, a channel layer is generally formed on a bottom source-drain that is later etched back in the non-fin regions during a fin patterning step. As the channel layer and the bottom source-drain are generally formed from a similar material, precise control of the etching step to etch only the channel layer is difficult to achieve. This lack of control of the etching step is exacerbated when multiple fins are patterned with varying pitch across the surface, as etching in regions of varying pitch results in varying gouge depth in the different regions that ultimately results in different gate to channel alignment.

The inventors hereof have developed a method of forming a bottom source-drain of a vertical FET that enables for better control of the bottom source-drain height resulting in an improved vertical FET. The method includes forming an anchor structure on a substrate such that the substrate includes a first anchor region, a second anchor region, and a middle region located there between. A sacrificial layer can be deposited on the middle region of the substrate and a channel layer can be deposited on the sacrificial layer. A vertical fin can be patterned on the substrate and the sacrificial layer can be removed to form a floating fin having a gap located between the floating fin and the substrate. The bottom source-drain layer can then be formed in the gap.

FIGS. 1-18 illustrate an embodiment of the fabrication of the bottom source-drain of a vertical component in accordance with embodiments of the present invention.

The fabrication of the bottom source-drain can be started with the component as illustrated in FIG. 1, which can comprise substrate 2, optional silicon film layer 4, and anchor structure 6 located on top of the substrate 2 or silicon film layer 4, if present. The anchor structure can comprise a first anchor region, a second anchor region, and a middle region located there between; wherein the middle region can be free of the anchor structure.

The substrate can have a thickness of 0.1 to 750 micrometers. The substrate can comprise bulk Si and can have a thickness of 700 to 800 micrometers. The substrate can comprise a semiconductor-on-insulator (SOI) (such as a silicon-on-insulator) and can have a thickness of 5 to 100 nanometers. The substrate can comprise silicon (Si), strained silicon, silicon carbide (SiC), germanium (Ge), silicon germanium (SiGe), silicon-germanium-carbon (SiGeC), a silicon alloy, a germanium alloy, gallium arsenide (GaAs), indium arsenide (InAs), indium phosphide (InP), cadmium arsenide, cadmium selenide, or a combination thereof.

The substrate can comprise a semiconductor-on-insulator (SOI) substrate with an optional silicon film layer. The silicon film layer can be a buried oxide (BOX) layer. The silicon film layer can comprise an oxide, for example, silicon dioxide, or can comprise a nitride, for example, silicon nitride.

The anchor structure can be formed from an anchor material that is not susceptible to etching processes such as reactive ion etching. The anchor structure can comprise silicon nitride ($Si_3N_4$), hafnium dioxide ($HfO_2$), hafnium tantalum titanium oxide (HfTaTiO), hafnium silicate ($HfSiO_4$), nitrided hafnium silicates (HfSiON), hafnium dioxide ($HfO_2$), zirconium dioxide ($ZrO_2$), zirconium silicate ($ZrSiO_4$), aluminum oxide ($Al_2O_3$), germanium oxynitride ($GeO_xN_y$), or a combination thereof. The anchor material can comprise a dielectric material such as silicon nitride. The anchor structure can be prepared by lithographic methods. For example, the anchor structure can be a resist. Suitable resists include photoresists, electron-beam resists, ion-beam resists, X-ray resists, and etchant resists. The resist can comprise a polymeric material, for example, that can be applied by spin casting. The anchor structure can be formed by lithographic techniques such as photolithography. The anchor structure can have an anchor structure height of 30 to 100 nanometers, or 40 to 80 nanometers.

A sacrificial layer can be deposited on the substrate in the region(s) free from the anchor structure. For example, the sacrificial layer can be deposited in a middle region located in between a first anchor region and a second anchor region. The sacrificial layer can comprise silicon germanium. The sacrificial layer can be deposited by epitaxial growth.

A channel layer can then be deposited on the sacrificial layer. The channel layer can comprise silicon germanium, silicon, a III-V compound (such as gallium arsenide), or a combination thereof. When the sacrificial layer and the channel layer both comprise silicon germanium, the channel layer can comprise a higher concentration of germanium. For example, the sacrificial layer can have a germanium concentration of 1 to 50 atomic %, or 5 to 20 atomic percent, or 5 to 10 atomic % and the channel layer can have a germanium concentration of 10 to 90 atomic %, or 20 to 40 atomic %. The channel layer can be deposited by epitaxial growth.

Figure 2:
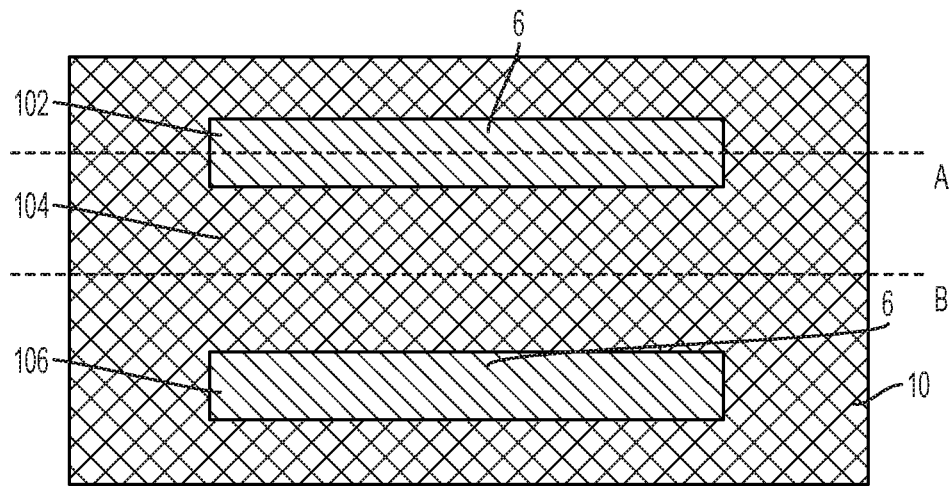

FIG. 2 is an illustration of a top view of a substrate having two anchor structures 6 located on a substrate in first anchor region 102 and second anchor region 106, where channel layer 10 has been deposited in the region free from the anchor structures in middle region 104.

Figure 3:
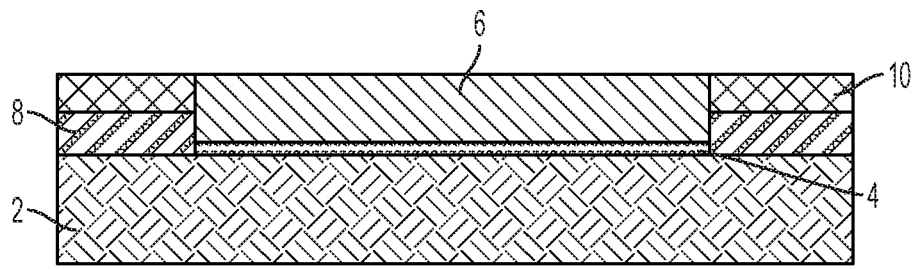
Figure 4:
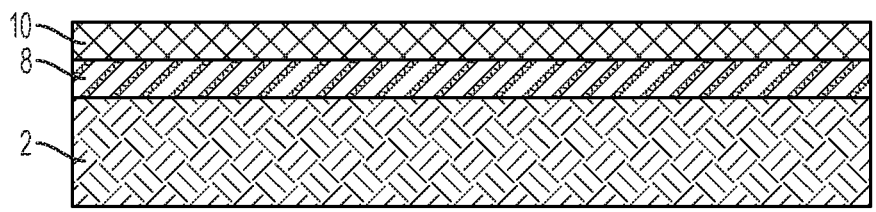

FIG. 3 is an illustration of the cross-section of the structure of FIG. 2 through anchor structure 6 along line A and FIG. 4 is an illustration of the cross-section of the structure of FIG. 2 through an anchor free region along line B. FIG. 3 and FIG. 4 illustrate that sacrificial layer 8 can be located in between substrate 2 and channel layer 10.

The sacrificial layer and the channel layer can each independently comprise silicon (Si), strained silicon, silicon carbide (SiC), germanium (Ge), silicon germanium (SiGe), silicon-germanium-carbon (SiGeC), a silicon alloy, a germanium alloy, gallium arsenide (GaAs), indium arsenide (InAs), indium phosphide (InP), cadmium arsenide, cadmium selenide, or a combination thereof. The sacrificial layer and the channel layer can comprise a different material. For example, the channel layer can comprise silicon that is free of germanium and the sacrificial layer can comprise silicon germanium.

After the sacrificial layer and the channel layer have been deposited, the vertical fins can be patterned on the substrate. The vertical fins can span from a first anchor region to a second anchor region. One or more vertical fins can be formed on the surface having the same or a varying pitch between the respective fins.

Figure 5:
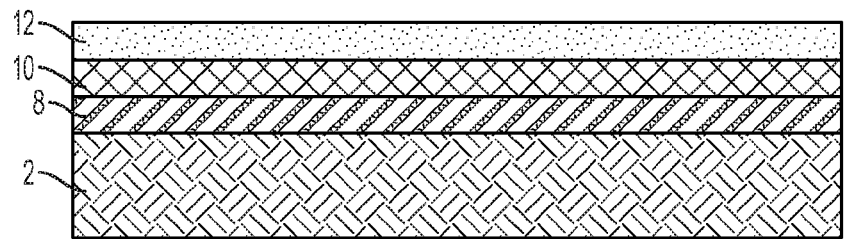

The vertical fins can be formed by side wall image transfer. FIGS. 5-8 illustrate an embodiment of forming the vertical fins using sidewall image transfer. First fin layer 12 can be deposited on the surface as is illustrated in FIG. 5. The fin layer can comprise silicon nitride ($Si_3N_4$), hafnium dioxide ($HfO_2$), hafnium tantalum titanium oxide (HfTaTiO), hafnium silicate ($HfSiO_4$), nitrided hafnium silicates (HfSiON), hafnium dioxide ($HfO_2$), zirconium dioxide ($ZrO_2$), zirconium silicate ($ZrSiO_4$), aluminum oxide ($Al_2O_3$), germanium oxynitride ($GeO_xN_y$), or a combination thereof. The fin layer can comprise silicon nitride.

Figure 6:
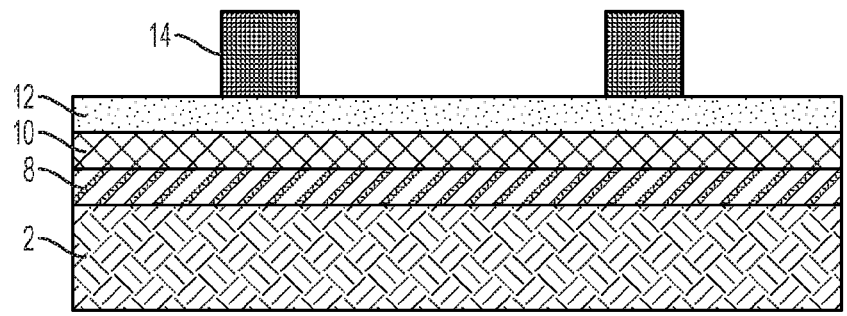

FIG. 6 illustrates that mandrel layer 14 can be formed on fin layer 12, for example, using lithographic techniques. In an embodiment, the mandrel layer can be formed by first depositing the mandrel layer on the fin layer; depositing an optional organic planarizing layer on the mandrel layer; depositing an optional anti-reflective coating on the organic planarizing layer; and depositing a mask layer on the anti-reflective coating. The mask material can comprise a resist such as a photoresist and the mandrel material can be patterned by photolithography. An optional adhesion layer can be formed on top of mandrel layer 14 prior to applying the mask material.

The mask layer can then be patterned to form features that will protect regions of the mandrel layer. The unprotected region can then be etched away in an etching step to form the patterned mandrel layer and the mask layer can be removed, for example, using a solvent or an aqueous developer, for example, using N-methyl-2-pyrrolidone (NMP), toluene, propylene glycol methyl ether acetate (PGMEA), tetramethylammonium hydroxide (TMAH), or a combination thereof.

Mandrel layer 14 can comprise a polymer, for example, a random copolymer including repeat units derived from styrene, methylmethacrylate, or a combination thereof. Mandrel layer 14 can comprise an inorganic material such as silicon dioxide, silicon nitride, and the like. Mandrel layer 14 can be initially deposited by spin coating prior to patterning.

Figure 7:
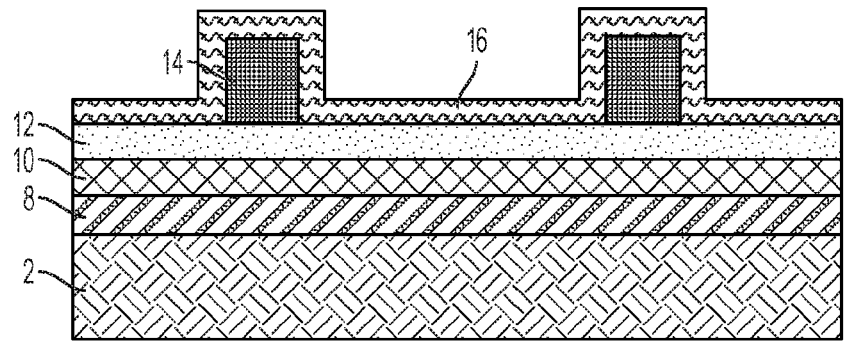

FIG. 7 illustrates that sidewall spacer layer 16 can then be deposited on mandrel layer 14 and on fin layer 12. Sidewall spacer layer 16 can form a layer on the sidewalls of the mandrel layer having a thickness of 5 to 100 nanometers, specifically, 10 to 100 nanometers, more specifically, 10 to 40 nanometers. Sidewall spacer layer can comprise silicon dioxide, silicon nitride, or a combination thereof.

Next, an anisotropic, top to bottom etching process, such as reactive ion etching, a remote plasma, diluted hydrogen fluoride (such as hydrogen fluoride diluted with ethylene glycol (HFEG)), or chemical vapor/sublimation, can be performed to expose the remaining mandrel layer 14 by removing the top facing sidewall spacer layer 16 including that located on top of mandrel layer 14. Following the top to bottom etching, the remaining mandrel layer 14, fin layer 12, and channel layer 10 can be removed, for example, by etching in the regions that are not protected by the sidewall features.

Figure 8:
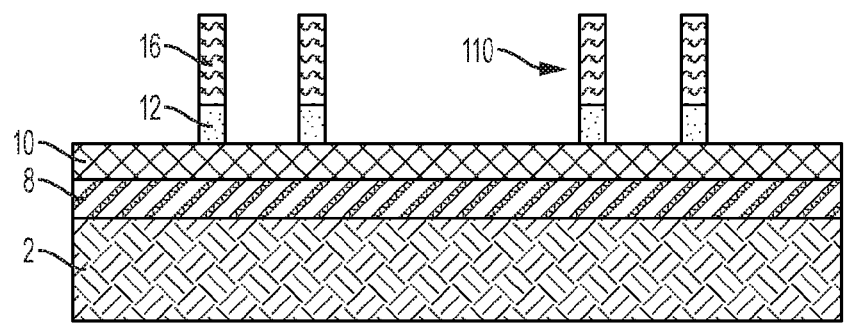

It is noted that etching of the top facing sidewall spacer layer 16, mandrel layer 14, fin layer 12, and channel layer 10 can be performed in a single step, for example, if mandrel layer 14 includes a carbon based material; or in multiple etching steps, for example, if mandrel layer 14 includes an inorganic material such as silicon nitride. Etching of channel layer 10 can be performed in a separate etching step. FIG. 8 illustrates that if channel layer 10 is performed in a separate etching step, then a first portion of the vertical fins are formed on the surface.

Figure 9:
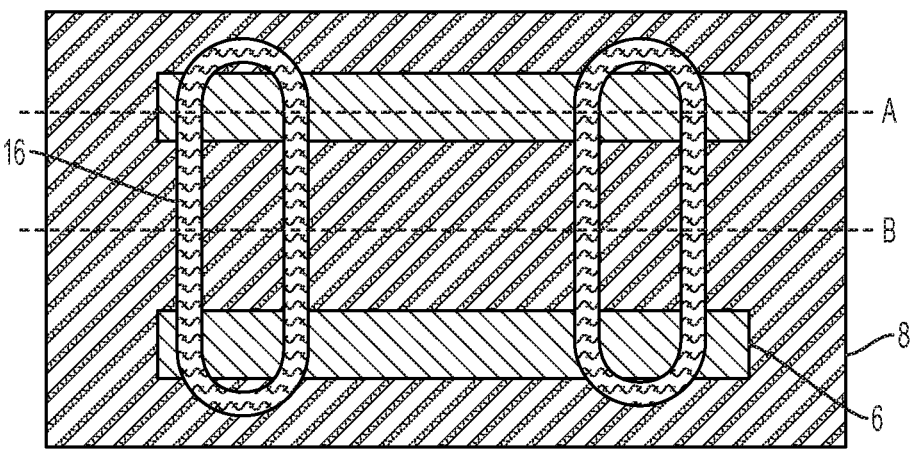
Figure 10:
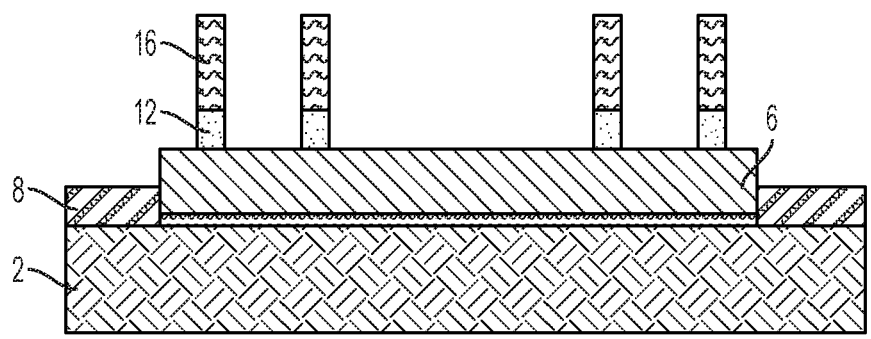
Figure 11:
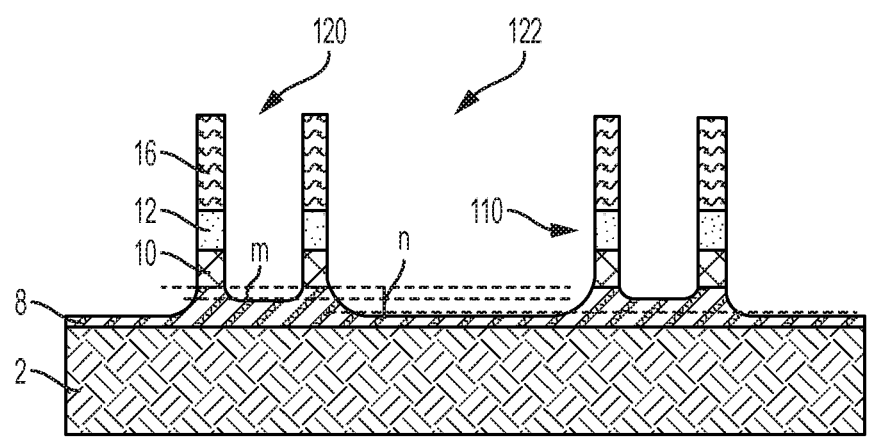

During the etching of channel layer 10, a portion of sacrificial layer 8 is also removed as is illustrated in FIG. 9-11. FIG. 9 is an illustration of a top-down view of the substrate after the etching of channel layer 10. FIG. 10 is an illustration of the cross-section of the structure of FIG. 9 through anchor structure 6 along line A and FIG. 11 is an illustration of the cross-section of the structure of FIG. 9 through an anchor free region along line B.

FIG. 9 illustrates that the fins span from first anchor region 102 to second anchor region 106, traversing middle region 104. FIG. 10 illustrates that the fins in the anchor regions comprise fin layer 12 and sidewall spacer layer 16 and that they are located on top of anchor structure 6. FIG. 11 illustrates that the fins in the middle region comprise channel layer 10, fin layer 12, and sidewall spacer layer 16 and that they are located on top of sacrificial layer 8. FIG. 11 further illustrates how the fin pitch can affect the etching depth of the sacrificial layer. For example, when the pitch of the fins is small such as in small pitch region 120, the etching depth will have a depth m; and when the pitch of the fins is larger such as in increased pitch region 122, the etching depth will have an increased depth n relative to that of depth m. It is noted, that this difference in etch depth based on the pitch of the fins is the same phenomenon that would have occurred had the sacrificial layer been the bottom source-drain layer that would have resulted in the varying gate to channel alignment across the vertical FET.

Figure 12:
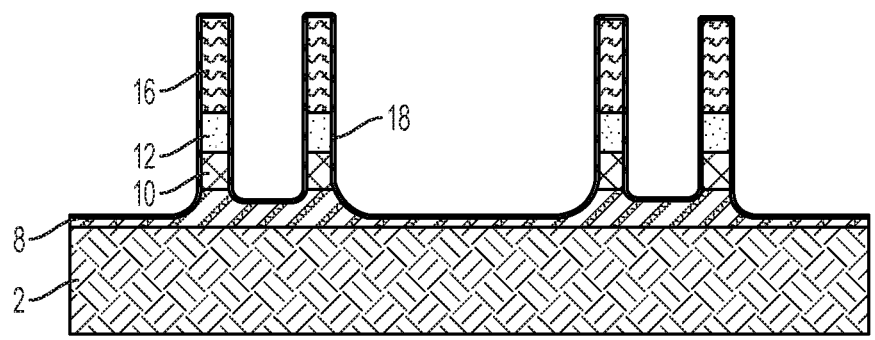

Next, oxide liner 18 can be deposited on the surface, as is illustrated in FIG. 12, and a linear etch back step can be performed to remove any top facing surfaces of the oxide liner while maintaining the presence of the oxide liner on the sidewalls of the fins. The oxide liner can function to protect the sides of the fins during the removal of the sacrificial layer. The oxide liner can comprise silicon dioxide ($SiO_2$), $Si_xGe_{1-x}O_y$, silicon oxy nitride ($SiO_xN_y$), or a combination thereof. Oxide liner 18 can have a thickness of 5 to 20 Angstroms, specifically, 10 to 15 Angstroms, or 5 to 8 Angstroms.

Figure 13:
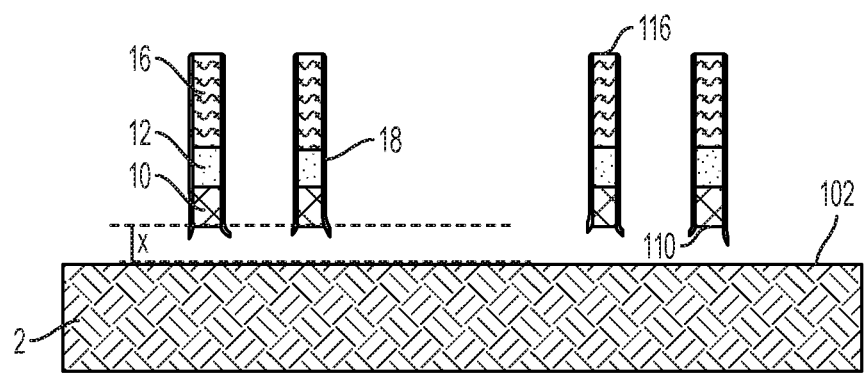

With reference to FIG. 13, sacrificial layer 8 can then be removed to form a gap in between substrate 2 and channel layer 10 in the middle region of the substrate. The gap can have a height x, where x can be 20 to 40 nanometers.

Figure 14:
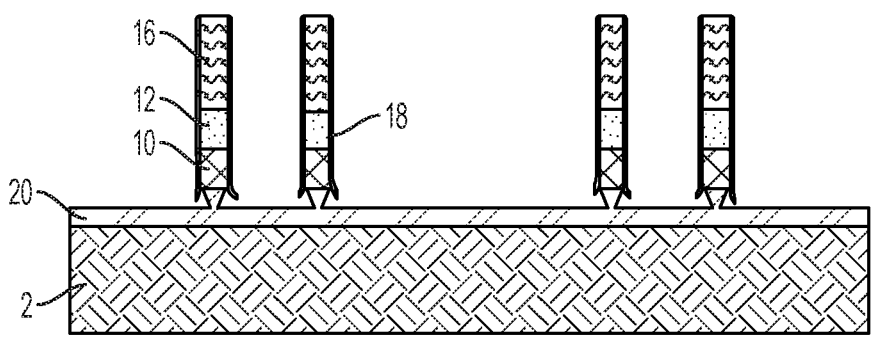

Finally, bottom source-drain layer can be deposited, where the bottom source-drain layer refers to a bottom source layer or a bottom drain layer. FIG. 13 and FIG. 14 illustrate that bottom source-drain layer 20 can be grown from both channel layer bottom surface 110 and from substrate top surface 102 to form bottom source-drain layer 20. The bottom source-drain layer can be formed by chemical vapor deposition (CVD), liquid phase (LP) chemical vapor deposition, reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The bottom source-drain layer can be formed by epitaxial growth of the silicon germanium layer on the silicon layer. The epitaxial growth of the silicon germanium layer can comprise epitaxial growth of a polysilicon doped with germanium. The bottom source-drain layer can comprise a p-type dopant (such as boron, indium, or a combination thereof) or an n-type dopant (such as phosphorus, arsenic, or a combination thereof).

Figure 15:
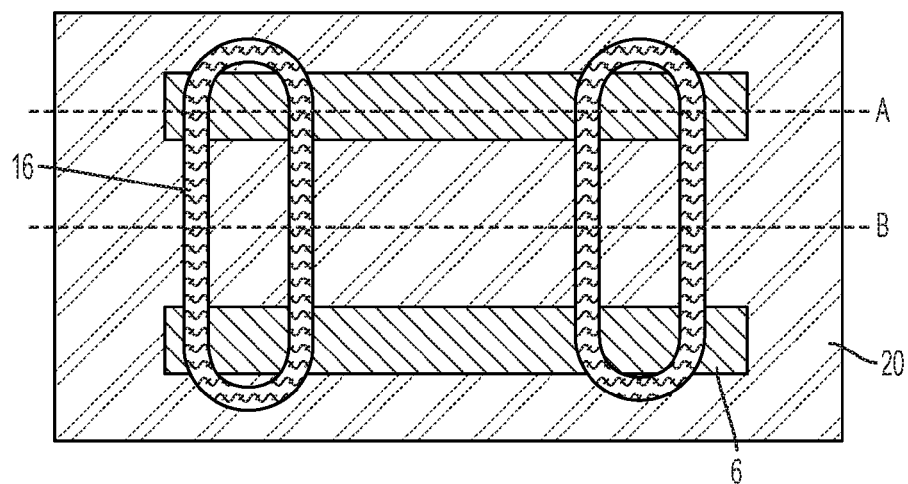
Figure 16:
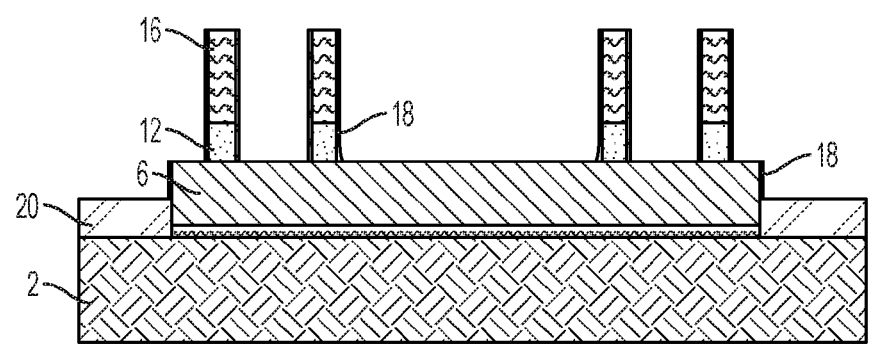
Figure 17:
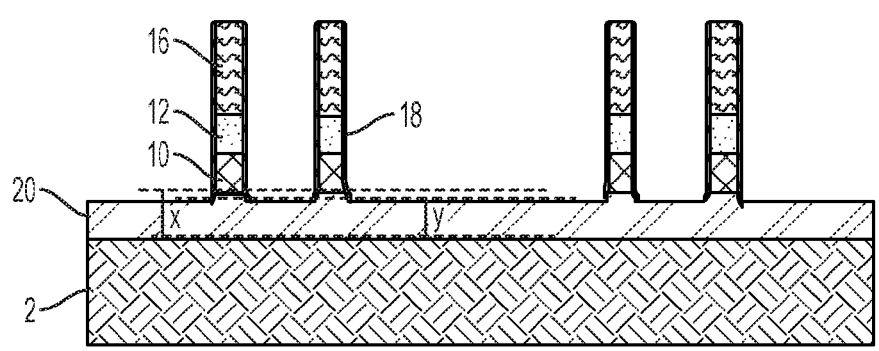

FIGS. 15-17 illustrate the vertical FET component having the formed bottom source-drain. FIG. 15 is an illustration of a top-down view of the substrate. FIG. 16 is an illustration of the cross-section of the structure of FIG. 15 through anchor structure 6 along line A and FIG. 17 is an illustration of the cross-section of the structure of FIG. 15 through an anchor free region along line B. FIG. 17 illustrates that the height x of the bottom source-drain layer in the regions under the fins (also referred to herein as the fin region) can be greater than the height y of the bottom source-drain layer that is not under the fins (also referred to herein as the non-fin region). The height x can be 20 to 40 nanometers, or 22 to 40 nanometers, or 25 to 40 nanometers. The height y of the bottom source-drain layer can be 10 to 20 nanometers, or 10 to 18 nanometers, or 10 to 15 nanometers.

Accordingly, FIG. 15-17 illustrate the that vertical FET component having the bottom source-drain layer formed thereon can comprise a substrate; a bottom source-drain layer located on the substrate; and a plurality of fins; wherein the fins comprise a channel layer located in between the bottom source-drain layer and a fin layer; wherein the fin layer is located in between the channel layer and a sidewall spacer layer. An oxide liner can be located on the sidewalls of the fins.

A thickness of the bottom source-drain layer under the fins can be 20 to 40 nanometers, or 22 to 40 nanometers, or 25 to 40 nanometers. A thickness of the bottom source-drain layer that is not under the fins can be 10 to 50 nanometers, or 10 to 20 nanometers, or 10 to 18 nanometers, or 10 to 15 nanometers. The thickness of the bottom source-drain layer that is not under the fins can vary by less than or equal to 2 nanometers, or less than or equal to 1 nanometer. For example, a thickness of the bottom source-drain layer that is in between fins having a first pitch can vary by less than or equal to 2 nanometers as compared to a thickness of the bottom source-drain layer that is located in between fins having a second pitch that is larger than the first pitch.

Figure 18:
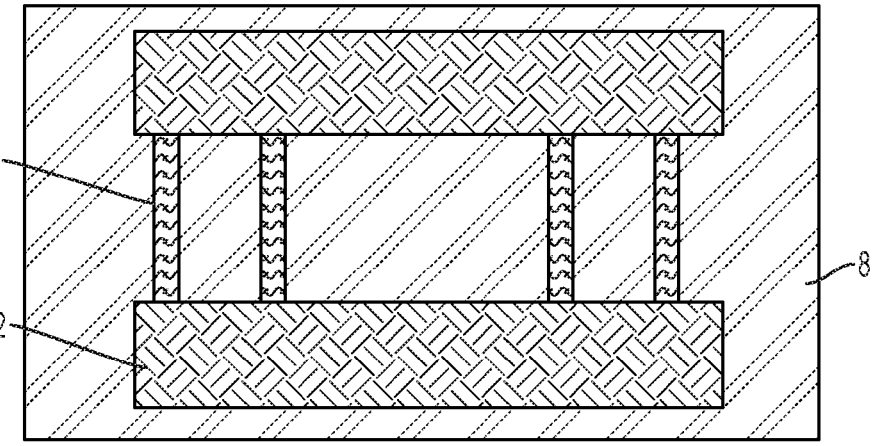

FIG. 18 illustrates that, after the bottom source-drain has been formed, the anchor structures can be removed, for example, to expose substrate 2. The anchor structures can be removed using a fin cut mask.

Figure 19:
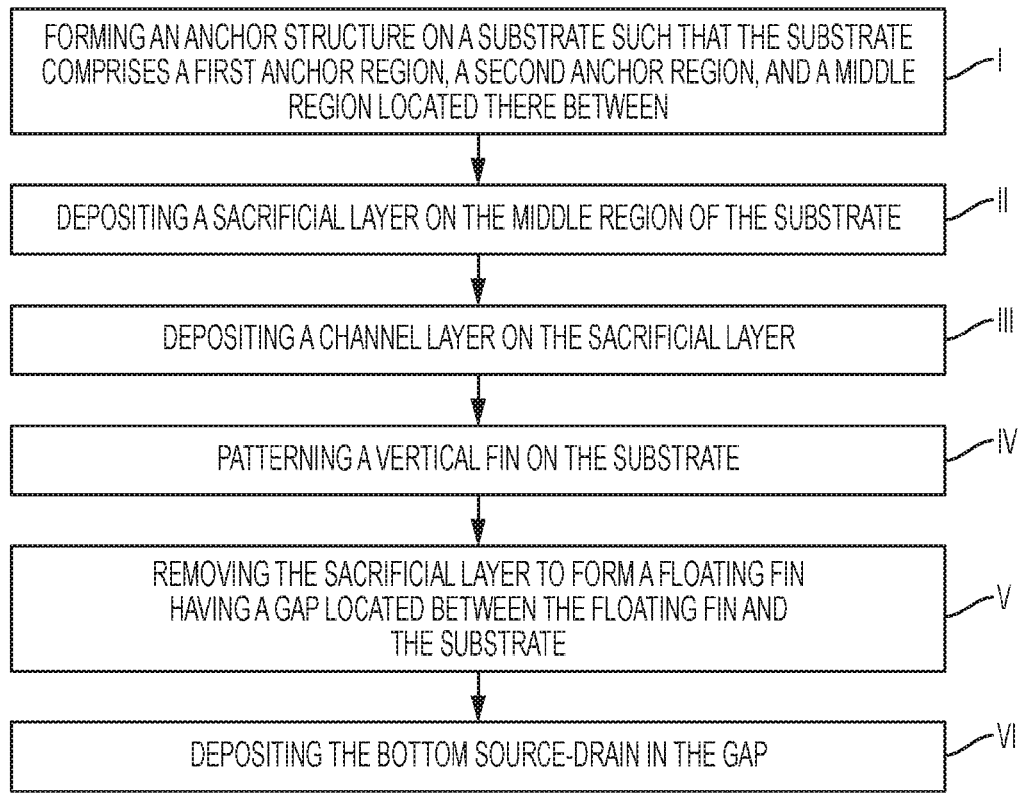

FIG. 19 is an illustration of an embodiment of a method of forming the bottom source-drain layer of the vertical FET component. Step I includes forming an anchor structure on a substrate such that the substrate includes a first anchor region, a second anchor region, and a middle region located there between. Step II includes depositing a sacrificial layer on the middle region of the substrate. Step III includes depositing a channel layer on the sacrificial layer. Step IV includes patterning a vertical fin on the substrate. Step V includes removing the sacrificial layer to form a floating fin having a gap located between the floating fin and the substrate. Step VI includes depositing the bottom source-drain in the gap.

Although not explicitly described herein, it is understood that the formed vertical FET component including the improved source-drain layer can be further processed to form a final vertical FET including, for example, a top source-drain layer and a gate electrode.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that includes a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular. "Or" means "and/or".

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of this invention.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A vertical field-effect transistor component comprising:
    an anchor structure formed on a substrate such that the substrate comprises a first anchor region, a second anchor region, and a middle region located there between;
    a channel layer formed on a sacrificial layer deposited over the middle region of the substrate such that a surface of the channel layer is coplanar with a surface of the anchor structure;
    a plurality of vertical fins formed to extend on the anchor structure over the first and second anchor regions of the substrate and on the channel layer over the middle region of the substrate,
    respective portions of the plurality of vertical fins forming, in the middle region, a plurality of floating fins having a gap located between the plurality of floating fins and the substrate in a space in the middle region from which the sacrificial layer is removed; and
    a bottom source-drain layer formed such that the bottom source-drain layer fills in the gap.

2. The vertical field-effect transistor component of claim 1, wherein the gap has a height of 20 to 40 nanometers.

3. The vertical field-effect transistor component of claim 1, wherein a thickness of the bottom source-drain layer located in a non-fin region is 10 to 20 nanometers.

4. The vertical field-effect transistor component of claim 3, wherein the thickness of the bottom source-drain layer located in the non-fin region varies by less than or equal to 2 nanometers.

5. The vertical field-effect transistor component of claim 1, further comprising an oxide liner formed on sidewalls of the plurality of vertical fins.

6. The vertical field-effect transistor component of claim 1, wherein the bottom source-drain layer located between fins having a first pitch has a first thickness and the bottom source-drain layer located between fins having a second pitch has a second thickness.

7. The vertical field-effect transistor component of claim 6, wherein the first thickness and the second thickness are within 2 nanometers.

8. The vertical field-effect transistor component of claim 6, wherein the first pitch and the second pitch are different.

9. A vertical field-effect transistor component comprising:
an anchor structure formed on a substrate such that the substrate comprises a first anchor region, a second anchor region, and a middle region located there between;
a channel layer formed on a sacrificial layer deposited over the middle region of the substrate such that a surface of the channel layer is coplanar with a surface of the anchor structure;
a plurality of vertical fins formed to extend on the anchor structure over the first and second anchor regions of the substrate and on the channel layer over the middle region of the substrate, respective portions of the plurality of vertical fins forming, in the middle region, a plurality of floating fins having a gap located between the plurality of floating fins and the substrate in a space in the middle region from which the sacrificial layer is removed; and
a bottom source-drain layer formed such that a first portion of the bottom source-drain layer fills in the gap under the fins;
wherein a thickness of the first portion of the bottom source-drain layer under the fins is 20 to 40 nanometers;
wherein a thickness of a second portion of the bottom source-drain layer located in a non-fin region is 10 to 20 nanometers.

10. The vertical field-effect transistor component of claim 9, wherein the thickness of the second portion of the bottom source-drain layer varies by less than or equal to 2 nanometers.

11. The vertical field-effect transistor component of claim 9, wherein the channel layer comprises silicon.

12. The vertical field-effect transistor component of claim 9, wherein the anchor structure has an anchor structure height of 30 to 100 nanometers.

* * * * *